(12) United States Patent
Xiang

(10) Patent No.: US 12,199,074 B2
(45) Date of Patent: Jan. 14, 2025

(54) DISPLAY PANEL AND MANUFACTURING METHOD THEREOF

(71) Applicant: TCL China Star Optoelectronics Technology Co., Ltd., Guangdong (CN)

(72) Inventor: Changming Xiang, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/607,484

(22) PCT Filed: Sep. 18, 2021

(86) PCT No.: PCT/CN2021/119333
§ 371 (c)(1),
(2) Date: Oct. 29, 2021

(87) PCT Pub. No.: WO2023/039882
PCT Pub. Date: Mar. 23, 2023

(65) Prior Publication Data
US 2024/0030193 A1    Jan. 25, 2024

(30) Foreign Application Priority Data
Sep. 14, 2021   (CN) .......................... 202111073784.7

(51) Int. Cl.
*H01L 25/075*    (2006.01)
*C09D 7/61*      (2018.01)
(Continued)

(52) U.S. Cl.
CPC ............ *H01L 25/0753* (2013.01); *C09D 7/61* (2018.01); *C09D 11/52* (2013.01); *H01L 33/62* (2013.01); *H01L 2933/0066* (2013.01)

(58) Field of Classification Search
None
See application file for complete search history.

(56) References Cited

U.S. PATENT DOCUMENTS 10,355,172 B1 * 7/2019 Ray .................. H01L 33/387
2019/0130821 A1 * 5/2019 Ogonowsky ........ H01L 25/0753
(Continued)

FOREIGN PATENT DOCUMENTS

| CN | 104953009 | 9/2015 |
| CN | 108610745 | 10/2018 |

(Continued)

OTHER PUBLICATIONS

International Search Report and the Written Opinion Dated Feb. 28, 2022 From the International Searching Authority Re. Application No. PCT/CN2021/119333 and Its Translation Into English. (14 Pages).

(Continued)

*Primary Examiner* — Michelle Mandala

(57) ABSTRACT

Disclosed are a display panel and a manufacturing method thereof. The display panel comprises: a substrate, a plurality of conductive units and a plurality of Mini LEDs. A material of the conductive units is conductive ink, and the conductive ink comprises a prepolymer, a monomer, a conductive filler and a photoinitiator. The viscosity of the conductive ink itself is employed to adsorb the Mini LEDs to improve the transfer accuracy of the Mini LEDs and to prevent the weak adsorption between the Mini LEDs and the conductive units, which affects the electrical connection between the conductive units and the Mini LEDs.

9 Claims, 3 Drawing Sheets

(51) Int. Cl.
*C09D 11/52* (2014.01)
*H01L 33/62* (2010.01)

(56) References Cited

U.S. PATENT DOCUMENTS

| | | | | |
|---|---|---|---|---|
| 2020/0251641 A1* | 8/2020 | Zhai | ................ | H01L 33/62 |
| 2020/0388209 A1* | 12/2020 | Chen | ................ | G09G 3/32 |
| 2021/0181267 A1* | 6/2021 | Lee | ................ | G01R 31/70 |

FOREIGN PATENT DOCUMENTS

| | | |
|---|---|---|
| CN | 108948867 | 12/2018 |
| CN | 110993777 | 4/2020 |
| CN | 210956671 | 7/2020 |
| CN | 111489991 | 8/2020 |
| CN | 111524931 | 8/2020 |
| CN | 111584507 | 8/2020 |
| CN | 111668362 | 9/2020 |
| CN | 113270437 | 8/2021 |
| CN | 113286431 | 8/2021 |
| JP | 2006-128161 | 5/2006 |
| WO | WO 2019/209047 | 10/2019 |

OTHER PUBLICATIONS

Notification of Office Action and Search Report Dated Jul. 22, 2023 From The State Intellectual Property Office of the People's Republic of China Re. Application No. 202111073784.7 and Its Translation Into English. (17 Pages).

\* cited by examiner

US 12,199,074 B2

DISPLAY PANEL AND MANUFACTURING METHOD THEREOF

RELATED APPLICATIONS

This application is a National Phase of PCT Patent Application No. PCT/CN2021/119333 having International filing date of Sep. 18, 2021, which claims the benefit of priority of Chinese Patent Application No. 202111073784.7 filed on Sep. 14, 2021. The contents of the above applications are all incorporated by reference as if fully set forth herein in their entirety.

FIELD AND BACKGROUND OF THE INVENTION

The present application relates to a display technology field, and more particularly to a display panel and a manufacturing method thereof.

In the current STM (Surface Mounted Technology) process of mini light emitting diodes (Mini LEDs), solder paste is generally applied to the bonding pads of the Mini LEDs to realize the electrical connection between the Mini LEDs and the substrate.

Since the patterns on the substrate are relatively dense, metal traces are interlaced and easily scratched. In the solder paste process, direct contact processes, such as screen printing and roller stamping, are generally used. The screen board of the screen printing has a larger contact depth with the substrate, and the pressure of the scraper of the screen printing is too large, which will scratch the metal traces. The uneven surface of the scraper of the screen printing, the roller of the roller stamping or the substrate will easily cause the contact area of the substrate with the scraper or the roller to become smaller, causing local stress concentration. It is easy to cause cracks in the insulating layer inside the substrate to cause a short circuit in direct contact between the gate layer and the source and drain layer. Moreover, the unsteady speed of the scraper or the roller can easily cause the uneven thickness of the solder paste, which may cause the Mini LED to be easily lifted up at the thicker part of the solder paste during placement, which will eventually cause the Mini LED to shift.

SUMMARY OF THE INVENTION

An objective of the present invention is to provide a display panel and a manufacturing method thereof, which can solve problems of metal traces being easily scratched and short circuits between metal traces in the solder paste process in the existing Mini LED bonding process.

For solving the aforesaid problems, the present invention provides a display panel, comprising: a subsrate; a plurality of conductive units, arranged on the substrate at intervals; and a plurality of Mini LEDs (mini light emitting diodes), arranged on a side of the conductive units away from the substrate at intervals; each of the Mini LEDs is electrically connected to the conductive units; wherein a material of the conductive units is conductive ink, and the conductive ink comprises a prepolymer, a monomer, a conductive filler and a photoinitiator.

Furthermore, the prepolymer comprises one of more of Hyperbranched urethane acrylate and Epoxy acrylate.

Furthermore, the monomer comprises one or more of trimethylolpropane triacrylate and pentanediol diacrylate.

Furthermore, the photoinitiator is isopropyl thioxanthone.

Furthermore, the conductive filler comprises one or more of spherical nano silver powder and flake-shaped nano silver powder.

Furthermore, a ratio of the monomer to the prepolymer ranges from 1:(1-2).

Furthermore, a ratio of the epoxy acrylate to the hyperbranched urethane acrylate ranges from 2:(2-4).

Furthermore, the display panel further comprises a plurality of conductive elements, arranged between the substrate and the conductive units at intervals, and arranged in one-to-one correspondence with the conductive units.

For solving the aforesaid problems, the present invention provides a manufacturing method of a display panel, comprising steps of: providing a substrate; coating conductive ink on the substrate, and patterning the conductive ink by using photolithography to form conductive ink units arranged on the substrate at intervals; wherein the conductive ink comprises a prepolymer, a monomer, a conductive filler and a photoinitiator; arranging a plurality of Mini LEDs (mini light emitting diodes) on a side of the conductive ink units away from the substrate at intervals, and each of the Mini LEDs is electrically connected to the conductive ink units; and curing the conductive ink units to form conductive units.

Furthermore, a thickness of the conductive ink ranges from 20 μm to 30 μm.

The present invention employs prepolymers, monomers, conductive fillers and photoinitiators to form conductive ink, and then employs conductive ink to prepare conductive units to achieve electrical connection between Mini LEDs and conductive elements. The viscosity of the conductive ink itself is employed to adsorb the Mini LEDs to improve the transfer accuracy of the Mini LEDs and to prevent the weak adsorption between the Mini LEDs and the conductive units, which affects the electrical connection between the conductive units and the Mini LEDs. The conductive unit is made by coating and photolithography, and the gap between adjacent conductive units can be controllably adjusted to further improve the transfer accuracy of Mini LEDs.

BRIEF DESCRIPTION OF THE SEVERAL VIEWS OF THE DRAWINGS

In order to more clearly illustrate the embodiments of the present application, the following figures will be described in the embodiments are briefly introduced. It is obvious that the drawings are only some embodiments of the present application, those of ordinary skill in this field can obtain other figures according to these figures without paying the premise.

COMPONENTS SYMBOL DESCRIPTION 100 display panel;
1 substrate;
3 conductive unit;
5 transferring substrate;
11 base substrate;
13 thin film transistor layer;
31 conductive ink;
2 conductive element;
4 Mini LED;
12 buffer layer;
14 planarization layer;
32 conductive ink unit.

DESCRIPTION OF SPECIFIC EMBODIMENTS OF THE INVENTION

Hereinafter, the preferred embodiments of the present invention will be described in detail with reference to the accompanying appended figures of the specification, so as to fully introduce the technical content of the present invention to those skilled in the art, so as to demonstrate that the present invention can be implemented by illustrations, so that the technical content disclosed by the present invention is clearer for making it easier for those skilled in the art to understand how to implement the present invention. However, the invention may be achieved in many different forms of embodiments, and the scope of the invention is not limited to the embodiments set forth herein. The description of the following embodiments is not intended to limit the scope of the present invention.

The terms of up, down, front, rear, left, right, interior, exterior, side, etcetera mentioned in the present invention are merely directions in appended figures. The directional terms used herein are employed to explain and describe the present invention, but not to limit the protection scope of the present invention.

In the appended figures, components with the same structure are denoted by the same numerals, and components with similar structures or functions are denoted by similar numerals. In addition, for ease of understanding and description, the size and thickness of each component shown in the appended figures are arbitrarily shown, and the present invention does not limit the size and thickness of each component.

Figure 1:
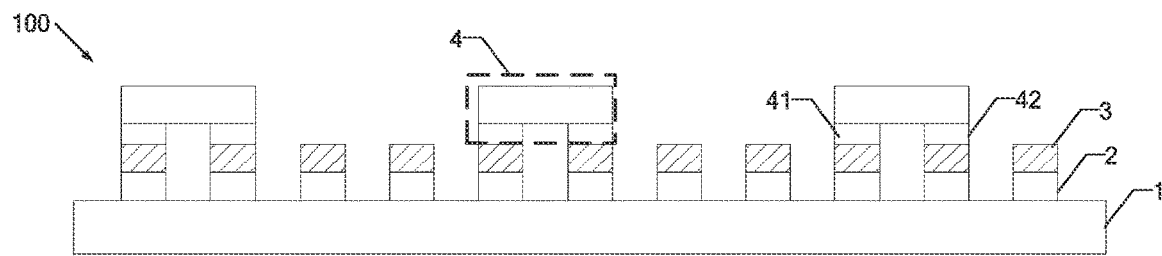
FIG. 1 is a structure diagram of a display panel of the present invention.

As shown in FIG. 1, this embodiment provides a display panel 100. The display panel 100 comprises: a substrate 1, a plurality of conductive elements 2, a plurality of conductive units 3 and a plurality of Mini LEDs 4.

Figure 2:
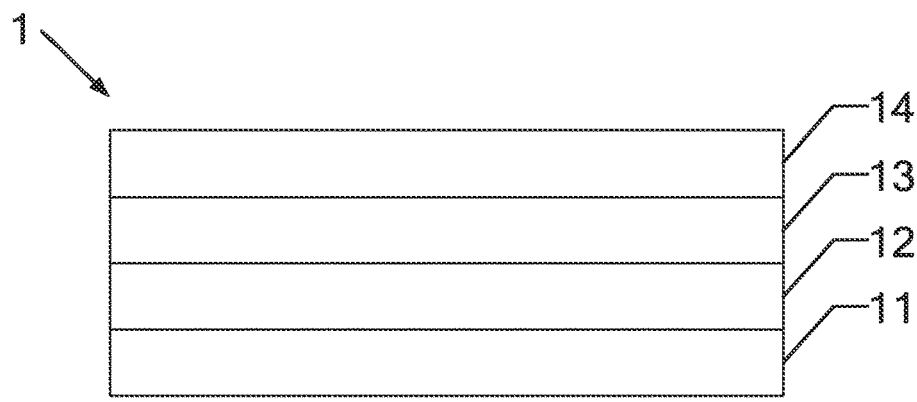
FIG. 2 is a structure diagram of substrate of the display panel of the present invention.
Figure 3:
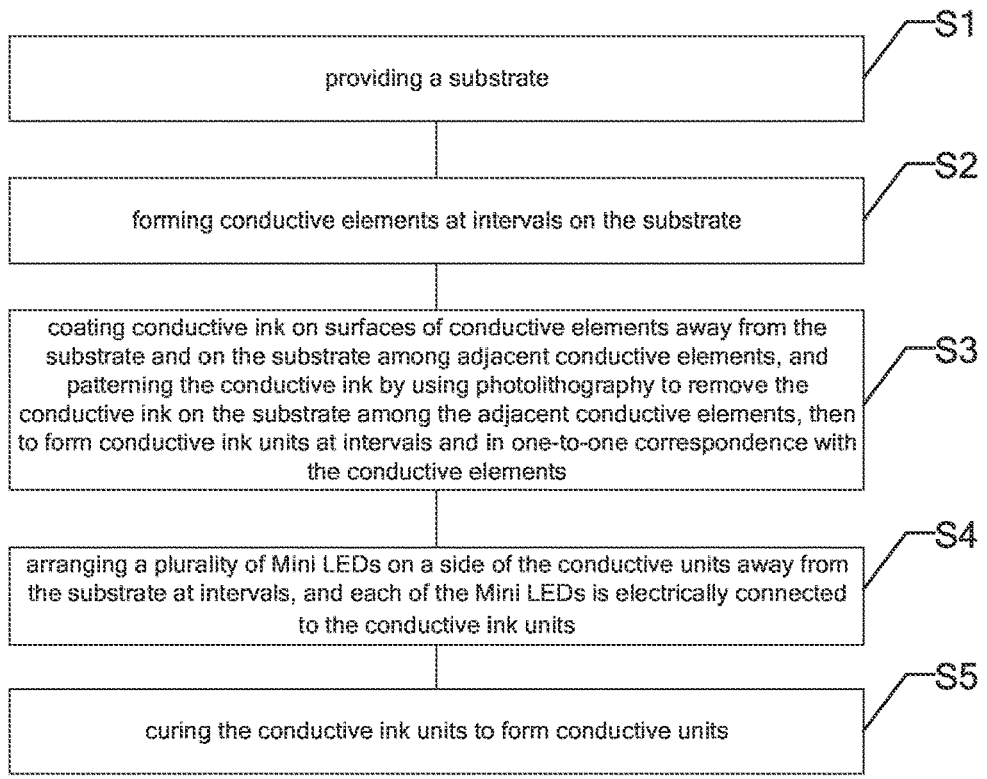
FIG. 3 is a diagram of manufacturing steps of the display panel of the present invention.

As shown in FIG. 2, the substrate 1 comprises a base substrate 11, a buffer layer 12, a thin film transistor layer 13 and a planarization layer 14.

A material of the base substrate 11 is one or more of glass, polyimide, polycarbonate, polyethylene terephthalate and polyethylene naphthalate. Therefore, the base substrate 11 can possess better impact resistance and can effectively protect the display panel 100.

The buffer layer 12 is arranged on a surface of the base substrate 11. The buffer layer 12 mainly functions as a buffer, and a material of the buffer layer 12 comprises one or more of SiNx and SiOx.

The thin film transistor layer 13 is arranged on a surface of the buffer layer 12 away from the base substrate 11. The thin film transistor layer 13 is mainly employed to control the electronic conversion of pixels and provide circuit support for the display panel 100. The thin film transistor layer 13 comprises an active layer, a first insulating layer, a gate layer, an interlayer insulating layer, a source and drain layer and other film layers, which will not be repeated here.

The planarization layer 14 is arranged on a surface of the thin film transistor layer 13 away from the base substrate 11. The planarization layer 14 mainly functions for planarization, and provides a planar surface for the preparation of the upper film layer, and the planarization layer 14 can also function for buffer. A material of the planarization layer 14 comprises one or more of acrylic photoresist, silicon photoresist and polyimide photoresist.

The plurality of conductive elements 2 are arranged on the substrate 1 at intervals. In this embodiment, a material of the conductive elements 2 is Indium tin oxide (ITO). In other embodiments, the conductive elements 2 can also be made of other conductive materials.

The plurality of conductive units 3 is arranged on a side of the conductive units 2 away from the substrate 1 at intervals and arranged in one-to-one correspondence with the conductive elements 2.

The plurality of Mini LEDs 4 is arranged on a side of the conductive units 3 away from the substrate 1 at intervals. Each of the Mini LEDs 4 comprises a first electrode 41 and a second electrode 42. The first electrode 41 and the second electrode 42 are both electrically connected to one conductive unit 3.

A material of the conductive units 3 is conductive ink 31, and the conductive ink 31 comprises a prepolymer, a monomer, a conductive filler and a photoinitiator.

The prepolymer comprises one of more of Hyperbranched urethane acrylate and Epoxy acrylate. A ratio of the epoxy acrylate to the hyperbranched urethane acrylate ranges from 2:(2-4). In this embodiment, the prepolymer comprises Hyperbranched urethane acrylate and Epoxy acrylate. The ratio of the epoxy acrylate to the hyperbranched urethane acrylate is 2:3.

The monomer comprises one or more of trimethylolpropane triacrylate and pentanediol diacrylate. A ratio of the monomer to the prepolymer ranges from 1:(1-2). In this embodiment, the ratio of the monomer to the prepolymer is 1:1.5.

In this embodiment, the photoinitiator is isopropyl thioxanthone (ITX). The content of the photoinitiator is 10% of the content of the conductive ink excluding the conductive filler.

The conductive filler comprises one or more of spherical nano silver powder and flake-shaped nano silver powder. In this embodiment, the conductive filler comprises spherical nano silver powder and flake-shaped nano silver powder. The ratio of the spherical nano silver powder to the flake-shaped nano silver powder is 3:7.

Therefore, the conductive ink 31 formed by mixing the prepolymer, monomer, conductive filler and photoinitiator of this embodiment possesses better conductivity, higher adhesion, shorter photo-curing time and lower resistivity. Specifically, the curing time range of the conductive ink 31 of this embodiment is 6 s-7 s, and the resistivity can reach 10-60 Ωm.

In conclusion, prepolymers, monomers, conductive fillers and photoinitiators are employed to form conductive ink 31, and then the conductive ink 31 is employed to prepare conductive units 3 to achieve electrical connection between Mini LEDs 4 and conductive elements 2. The viscosity of the conductive ink 31 itself is employed to adsorb the Mini LEDs 4 to improve the transfer accuracy of the Mini LEDs 4 and to prevent the weak adsorption between the Mini LEDs 4 and the conductive units 3, which affects the electrical connection between the conductive units 3 and the Mini LEDs 4.

As shown in FIG. 3 to FIG. 8, the present invention provides a manufacturing method of a display panel 100, comprising steps of: S1, providing a substrate 1; S2, forming conductive elements 2 at intervals on the substrate 1; S3, coating conductive ink 31 on surfaces of conductive elements 2 away from the substrate 1 and on the substrate 1 among adjacent conductive elements 2, and patterning the conductive ink 31 by using photolithography to remove the conductive ink 31 on the substrate 1 among the adjacent conductive elements 2, then to form conductive ink units 32 at intervals and in one-to-one correspondence with the conductive elements 2; wherein the conductive ink 31 comprises a prepolymer, a monomer, a conductive filler and a photoinitiator; S4, arranging a plurality of Mini LEDs 4 on a side of the conductive units 3 away from the substrate 1 at intervals, and each of the Mini LEDs 4 is electrically connected to the conductive ink units 32; and S5, curing the conductive ink units 32 to form conductive units 3.

Figure 4:
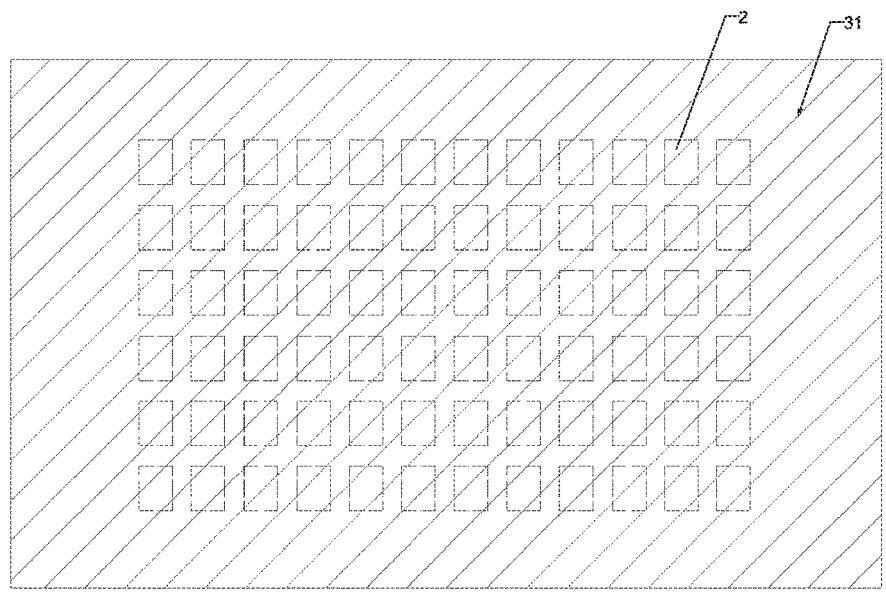
FIG. 4 is a plan view diagram of the display panel after coating conductive ink on the substrate among the conductive elements.

As shown in FIG. 4, A thickness of the conductive ink 31 ranges from 20 μm to 30 μm. In this embodiment, the thickness of the conductive ink 31 is 25 μm.

Figure 5:
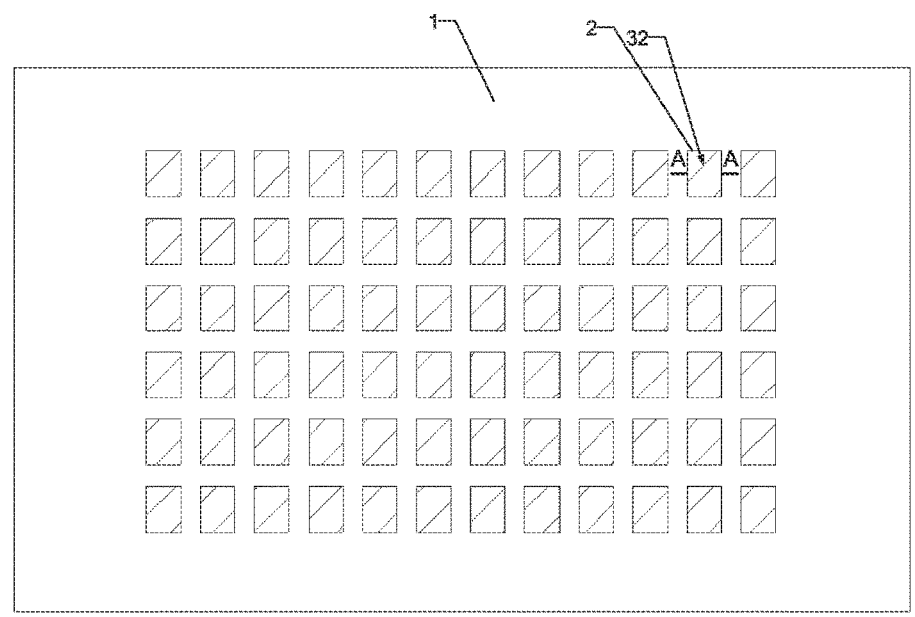
FIG. 5 is a plan view diagram of the conductive ink of FIG. 4 being patterned to form conductive ink units.
Figure 6:
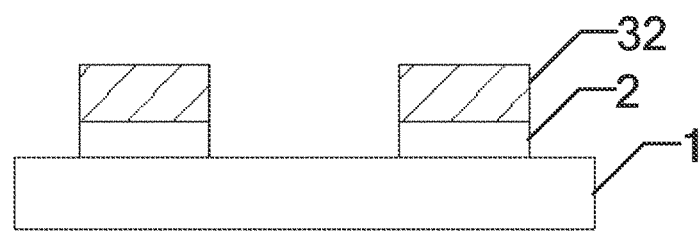
FIG. 6 is a cross-sectional view diagram taken along line A-A of FIG. 5.

As shown in FIG. 5 and FIG. 6, by using photolithography to remove the conductive ink 31 on the substrate 1 among the adjacent conductive elements 2, the conductive ink units 32 at intervals and in one-to-one correspondence with the conductive elements 2 are formed. The gap between adjacent conductive ink units 32 can be controllably adjusted to further improve the transfer accuracy of Mini LEDs 4.

Figure 7:
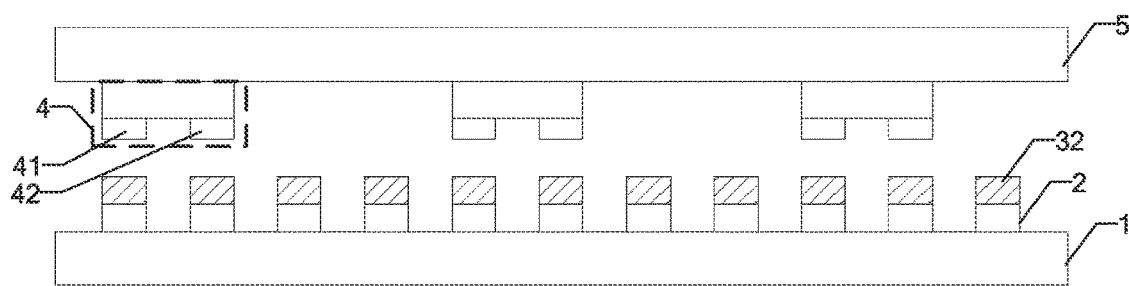
FIG. 7 is a structure diagram of disposing the Mini LEDs on the conductive ink units.

As shown in FIG. 7, the Mini LEDs 4 are prepared on the transferring substrate 5. Then, the Mini LEDs 4 and the transferring substrate 5 as a whole are hot-pressed or cold-pressed on the surface of the conductive ink units 32 on the side away from the substrate 1. The viscosity of the conductive ink units 32 themselves is employed to adsorb the Mini LEDs 4 to improve the transfer accuracy of the Mini LEDs 4 and to prevent the weak adsorption between the Mini LEDs 4 and the conductive ink units 32, which affects the electrical connection between the conductive ink units 32 and the Mini LEDs 4.

Figure 8:
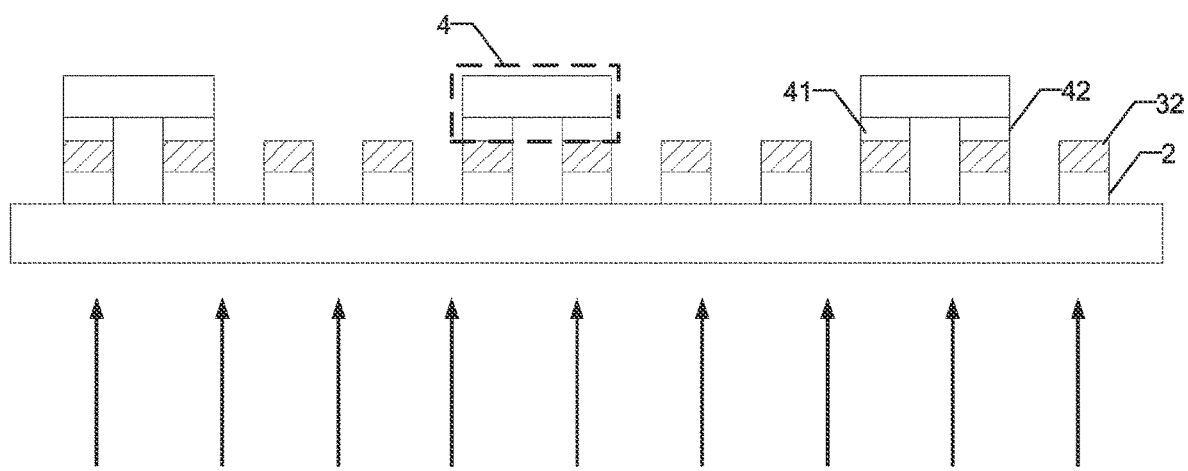
FIG. 8 is a structure diagram of removing the transferring substrate of FIG. 6 and curing the conductive ink units.

As shown in FIG. 8, the transferring substrate 5 is stripped and removed first, and then the conductive ink units 32 are cured by ultraviolet light (UV light) to form the conductive units 3.

The display panel and the manufacturing method thereof provided by the embodiments of the present application are described in detail as aforementioned, and the principles and implementations of the present application have been described with reference to specific illustrations. The description of the foregoing embodiments is merely for helping to understand the technical solutions of the present application and the core ideas thereof; meanwhile, those skilled in the art will be able to change the specific embodiments and the scope of the application according to the idea of the present application. In conclusion, the content of the specification should not be construed as limiting the present application.

What is claimed is:

1. A display panel, comprising:
   a substrate;
   a plurality of conductive elements, arranged on the substrate at intervals;
   a plurality of conductive units, arranged on a side of the conductive elements away from the substrate at intervals, and arranged in one-to-one correspondence with the conductive elements; and
   a plurality of Mini LEDs (mini light emitting diodes), arranged on a side of the conductive units away from the substrate at intervals; each of the Mini LEDs is electrically connected to the conductive units;
   wherein a material of the conductive units is conductive ink, and the conductive ink comprises a prepolymer, a monomer, a conductive filler and a photoinitiator; and
   wherein the conductive ink adsorbs the Mini LEDs, and an orthographic projection of each of the conductive units on the substrate is completely overlapped with an orthographic projection of corresponding one of the conductive elements on the substrate.

2. The display panel according to claim 1, wherein the prepolymer comprises one of more of Hyperbranched urethane acrylate and Epoxy acrylate.

3. The display panel according to claim 1, wherein the monomer comprises one or more of trimethylolpropane triacrylate and pentanediol diacrylate.

4. The display panel according to claim 1, wherein the photoinitiator is isopropyl thioxanthone.

5. The display panel according to claim 1, wherein the conductive filler comprises one or more of spherical nano silver powder and flake-shaped nano silver powder.

6. The display panel according to claim 1, wherein a ratio of the monomer to the prepolymer ranges from 1:(1-2).

7. The display panel according to claim 2, wherein a ratio of the epoxy acrylate to the hyperbranched urethane acrylate ranges from 2:(2-4).

8. A manufacturing method of a display panel, comprising steps of:
   providing a substrate;
   forming a plurality of conductive elements arranged on the substrate at intervals;
   coating conductive ink on a side of the conductive elements away from the substrate, and patterning the conductive ink by using photolithography to form conductive ink units arranged on the side of the conductive elements away from the substrate at intervals and arranged in one-to-one correspondence with the conductive elements; wherein the conductive ink comprises a prepolymer, a monomer, a conductive filler and a photoinitiator;
   arranging a plurality of Mini LEDs (mini light emitting diodes) on a side of the conductive ink units away from the substrate at intervals, and each of the Mini LEDs is electrically connected to the conductive ink units; and
   curing the conductive ink units to form conductive units,
   wherein the conductive ink adsorbs the Mini LEDs, and an orthographic projection of each of the conductive units on the substrate is completely overlapped with an orthographic projection of corresponding one of the conductive elements on the substrate.

9. The manufacturing method according to claim 8, wherein a thickness of the conductive ink ranges from 20 μm to 30 μm.

\* \* \* \* \*